United States Patent [19]

Engeler et al.

[11] 3,770,988

[45] Nov. 6, 1973

[54] SELF-REGISTERED SURFACE CHARGE LAUNCH-RECEIVE DEVICE AND METHOD FOR MAKING

[75] Inventors: William E. Engeler, Scotia; Jerome J. Tiemann, Schenectady, both of N.Y.

[73] Assignee: General Electric Company, Schenectady, N.Y.

[22] Filed: Sept. 4, 1970

[21] Appl. No.: 69,649

[52] U.S. Cl. .......... 307/304, 317/235 R, 317/235 G

[51] Int. Cl. .......... H01l 11/14

[58] Field of Search .......... 317/235 B, 235 G, 317/235 AG

[56] References Cited

UNITED STATES PATENTS

| | | | |
|---|---|---|---|
| 3,651,349 | 3/1972 | Kahng et al. | 317/235 |
| 3,660,697 | 5/1972 | Berglund et al. | 317/235 |
| 3,264,493 | 8/1966 | Price et al. | 307/88.5 |
| 3,339,128 | 8/1967 | Olmstead | 317/235 |

FOREIGN PATENTS OR APPLICATIONS

| | | | |
|---|---|---|---|
| 6,805,705 | 10/1969 | Netherlands | 317/235 |

OTHER PUBLICATIONS

Applied Physics Letters, "Charge Coupled 8–Bit Shift Register" by Tompsett et al. Vol. 17, No. 3, Aug. 1, 1970, pages 111–115.

Boyle et al., "B. S. T. J. Briefs," April 1970, pp. 587–593.

*Primary Examiner*—Jerry D. Craig
*Attorney*—John F. Ahern, Paul A. Frank, Jerome C. C. Squillaro, Frank L. Neuhauser, Oscar B. Waddell and Joseph B. Forman

[57] ABSTRACT

A device for launching, receiving and amplifying surface charges from a conductor-insulator-semiconductor (CIS) structure and a method for making the device are disclosed. In one embodiment the device includes a double-diffused region wherein the outer diffused region extends under and is adjacent to a conductor member of a storage element. Surface charges adjacent the double-diffused region forwardly bias the outer diffused region relative to the inner diffused region and cause current multiplication. The effective gain obtained from this device is approximately equal to the forward current gain of a bipolar transistor. In another embodiment a single diffused region extends under a conductor member of a storage element to launch surface charges into and to receive surface charges from a storage element. A method for making both type devices self-registered with the storage element is also disclosed.

7 Claims, 4 Drawing Figures

Inventors:
William E. Engeler,
Jerome J. Tiemann,
by Jerome C. Squillaro
Their Attorney.

Inventors:
William E. Engeler,
Jerome J. Tiemann,
by [signature]
Their Attorney.

SELF-REGISTERED SURFACE CHARGE LAUNCH-RECEIVE DEVICE AND METHOD FOR MAKING

This invention relates to semiconductor devices and more particularly, to semiconductor surface charge launch-receive devices which are formed as a part of a conductor-insulator-semiconductor information storage and transfer system.

In our copending application Ser. No. 56,353, filed July 20, 1970, we have disclosed methods and apparatus for storing and transferring surface charges from one portion of a semiconductor substrate to another. In that application we also disclosed the use of P-N junctions for receiving charge from a storage element so that information in the form of stored charge can be read out of the CIS structure. While various techniques may be employed to produce a P-N junction for receiving the surface charges, it is desirable to provide a method and apparatus for receiving charges which is compatible with the same technology employed in fabricating the storage element themselves. Additionally, the desirability of providing high density CIS storage arrays necessarily requires the use of exceedingly small storage elements. However, as the size of the storage element decreases, the magnitude of the stored charge which it is capable of storing is also decreased. Accordingly, it is desirable to provide a receive device which in addition to receiving the stored charge provides charge amplification. In addition to receiving surface charges, it is also desirable to provide a device for launching a surface charge into a storage element.

It is therefore an object of this invention to provide a device for launching and receiving surface charge which is compatible with the CIS storage element.

It is a further object of this invention to provide amplification of the charge receive from a CIS storage element.

It is yet another object of this invention to provide launch and receive devices which are self-registered with a CIS storage element.

It is still another object of this invention to provide methods for making devices for receiving charges from a CIS structure which is compatible with technology for making integrated circuits.

Briefly stated, in accord with the present invention, a device for launching and receiving surface charge from a storage element in a CIS structure is provided by forming a conductivity-modified surface-adjacent region in a semiconductor body such as a P-N junction in which a conductor member insulatingly overlying the semiconductor body serves as a diffusion defining mask for the formation of the conductivity modified region. By contacting the conductivity modified region and applying a bias voltage between this region and the semiconductor body, an electrical surface charge underlying the adjacent conductor member can be launched (injected into) a storage element or extracted from a storage element in the CIS structure. Charge amplification is provided by forming a second diffusion region of opposite conductivity within the confines of the first diffusion region and by contacting the second diffusion region and biasing this region with respect to the semiconductor body such that the output signal derived from the double diffused device is substantially equal to the product of the current gain of the double diffused device and the magnitude of the electrical surface charge underlying the adjacent conductor member.

The novel features believed characteristic of the present invention are set forth in the appended claim. The invention itself, together with further objects and advantages thereof, may be best understood with reference to the following description, taken in connection with the accompanying drawing in which:

FIGS. 4*a* – 4*f* illustrates a portion of a CIS structure during the various steps of the performance of the process illustrated by the flow diagram of FIG. 3 at the corresponding stages thereof.

Figure 1:
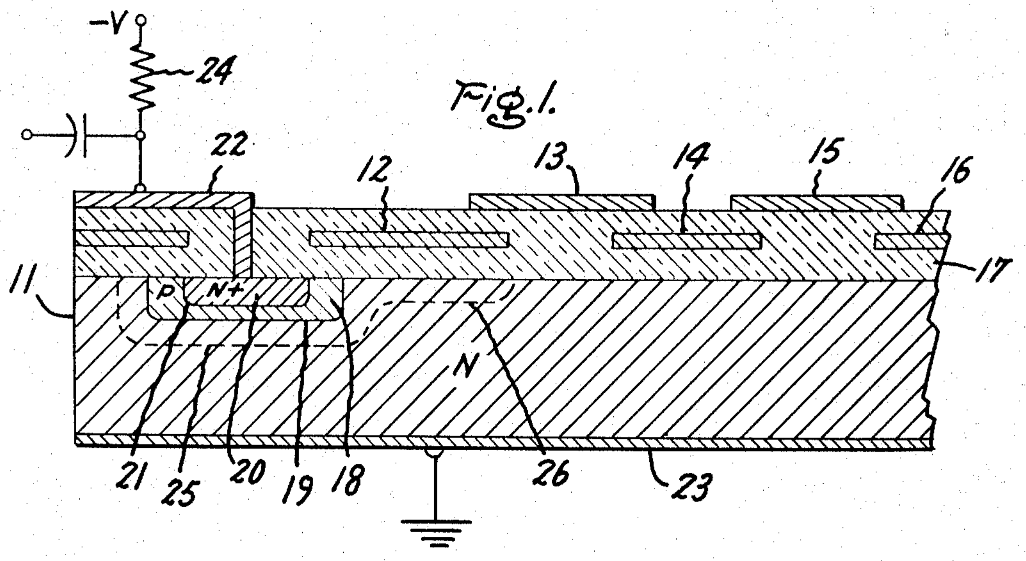
FIG. 1 is a cross-sectional view of a portion of a CIS structure employing a charge receive device in accord with one embodiment of our invention.

By way of example, FIG. 1 illustrates schematically a partial cross-sectional view of a CIS structure 10 comprising a semiconductor body 11 with a plurality of conductor members 12 through 16 insulatingly overlying the semiconductor body 11. The conductor members 12, 14 and 16 form a first group which are substantially the same distance from the major surface of the semiconductor body 11 and conductor members 13 and 15 form a second group which are spaced at a slightly greater distance from the semiconductor body 11. The conductor members of the first group are spaced from the semiconductor body 11 and the conductor members of the second group by insulator material 17. By this arrangement, all conductor members are electrically isolated from each other and conductor members 13 and 15 insulatingly overlap adjacent conductor members of the first group.

FIG. 1 also illustrates a surface adjacent conductivity-modified region 18 which forms an asymmetrically conducting P-N junction with the semiconductor body 11. For ease of description, assume that the semiconductor body 11 is of a first-conductivity type such as, for example, N-type conductivity and that the conductivity modified region 18 is of an opposite-conductivity type, such as P-type conductivity thereby forming a P-N junction 19. Within the confines of the P-type conductivity region 18, a shallower first-conductivity-type region 20 and hence a P-N junction 21 is formed. Regions 18 and 20 are preferably formed by diffusion from appropriate impurity sources in a manner described below. A contact 22 is made to the diffusion region 20 and a contact 23 is made to the semiconductor body 11 so that bias voltages may be applied to the CIS structure. No contact, however, is made in the diffusion region 18 since conduction is by overlapping depletion regions, in a manner more fully described below.

The operation of the CIS structure of FIG. 1 can be best understood by considering the sequence of events which occur as an electrical charge is transferred (e.g., from right to left) along the surface-adjacent portion of the semiconductor body 11. Assume that a depletion region forming voltage is applied to the conductor member 15 and that within the depletion region formed an electrical charge is stored. This charge may have been acquired from under the previous conductor member 16 or from the introduction of minority carriers from a point contact, a P-N junction or from electromagnetic radiation as is more fully disclosed in our copending applications Ser. No. 792,488 now U.S. Pat. No. 3,623,026 and 792,569 filed Jan. 21, 1969 and of common assignee. By whatever means employed to produce a charge within the depletion region underlying conductor member 15, the charge may be transferred to a depletion region underlying conductor member 14 by the application of a depletion region forming voltage to conductor member 14 while removing the depletion region forming voltage from conductor member 15. In a similar manner, this charge may then be transferred to a depletion region under conductor member 13 and finally to a depletion region underlying conductor member 12. The mechanism whereby electrical charges are transferred along the surface of a CIS structure are more fully disclosed in our aforementioned application Ser. No. 56,353.

A negative bias voltage applied to the contact 22 relative to the semiconductor body 11 through a resistor 24 reverse biases the P-N junction 19 and forms a depletion region 25. When a depletion region 26 of sufficient depth is formed under the conductor member 12, as described above, the depletion regions 25 and 26 overlap or merge together. An electrical charge, if any, stored within the depletion region 26 underlying the conductor member 12 is coupled to the P-type diffusion region 18 by surface conduction. With the introduction of charge into the P-type region 18, the potential barrier between the P-type region 18 and the N+-type region 20 is reduced sufficiently so that electrons flow from the negative voltage source through the resistor 24, the N+-type region 20, the P-type region 18 and into the semiconductor body 11 to the reference potential.

Not all the electrons injected at the N+-type region 20 reach the N-type region 11. Some recombine with the holes introduced into the P-type region from the depletion region 26 underlying the conductor member 12 and hence never reach the N-type region 11. The difference between the total injected electron current and that fraction which passes through the N-type region 11 is characterized by the transport factor which is only slightly less than unity since many more electrons reach the N-type region 11 than combine with holes from the depletion region 26. The transport factor is maximized if the area of the P-N junction 19 formed between region 18 and the semiconductor 11 is not large compared to the area of the P-N junction 21 formed between the region 20 and the region 18, with the spacing between the P-N junctions as small as possible. In practice, however, other considerations, such as junction capacitance, require compromises in the transport factor.

Another important parameter to be considered is the ratio of injected electrons to total current of electrons plus holes flowing across junction 21. In a transistor, this ratio is referred to as the emitter efficiency; this terminology will be used here. The emitter efficiency is most easily maximized by heavily doping the emitter (region 20) relative to the base (region 18) so that the ratio of holes in the base to electrons in the emitter is very small.

By maximizing the transport factor and emitter efficiency, the ratio of the current flow through the semiconductor 11 to the current flow into the P-type region 18 which is lost to recombination with the holes is also maximized. This ratio is called the current amplification factor of the device.

The desirability of maximizing the current amplification factor is readily apparent since electrical charges stored within the depletion region underlying the conductor member 12 and received by the charge receive device of our invention are amplified by the amplification factor of the device itself. Hence, the greater the current amplification factor, the smaller the size of the storage area required, thereby providing the capability of higher density storage systems. In the event that no surface charge is present under the conductor member 12, the current flowing between the N+-type region 20 and the N-type region 11 is insufficient to produce an output signal.

In FIG. 1 we have disclosed a double diffused charge receive device having amplification characteristics, however, as pointed out above, a single diffused device can be used for either launching or receiving surface charges from a CIS structure. This feature of our invention is more particularly pointed out in FIG. 2 wherein a partial plan view of a CIS structure 30 comprising two adjacent information storage and transfer channels 31 and 32 are illustrated with transversely overlapping conductor members 33, 34 and 35 substantially similar to conductor members 12, 14 and 16 of FIG. 1. Conductor member 36 and 37 insulatingly overlap conductor member 33, 34 and 35 in a similar manner as conductor members 13 and 15. Adjacent conductor member 33 and substantially within the area of one end of the information channel 31 is a diffusion region 38 of P-type conductivity, for example, formed in an underlying semiconductor substrate 39 of N-type conductivity, for example. The diffusion region 38 forms with the semiconductor substrate 39, a P-N junction 40 which extends beneath the conductor member 33, in a manner similar to P-N junction 19 of FIG. 1. Contact is made to the diffusion region 38 by an electrode 41 which insulatingly overlies the CIS structure.

The information channel 32 has a similar P-type diffusion region 42 which forms a P-N junction 43 formed in the semiconductor substrate 39. An electrode 44 contacts the P-type region 42 and forms an interconnection path with a semiconductor device, such as, a field-effect transistor 45. The transistor 45 comprises a gate electrode 46 insulatingly overlying adjacent diffusion regions 47 and 48 of P-type conductivity, for example, which form source and drain regions for the transistor. Electrodes 49 and 50 contact the diffusion regions 47 and 48, respectively, and may, for example, be connected to suitable bias and output circuitry, as is conventionally done in integrated circuitry.

Figure 2:
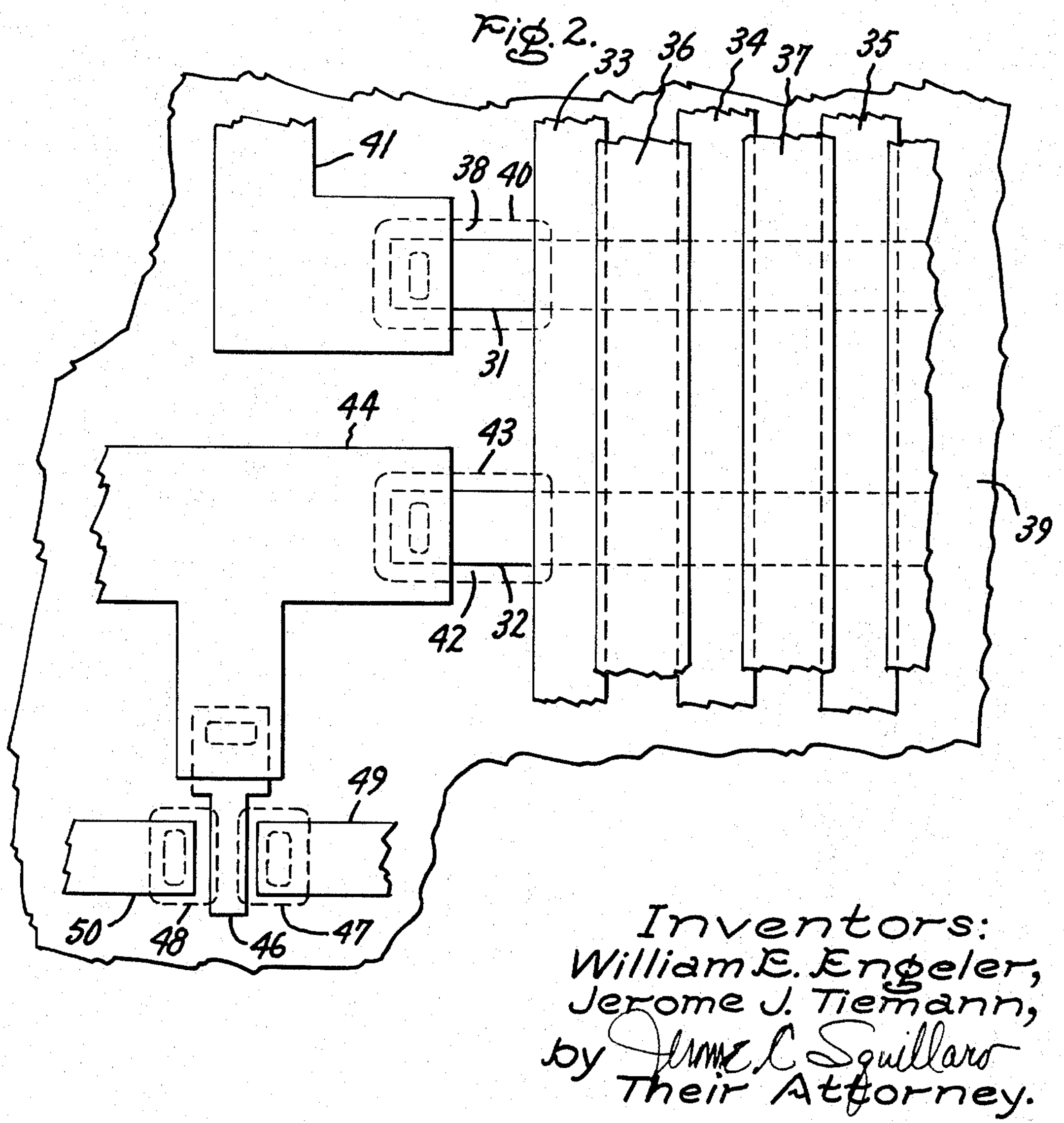
FIG. 2 is a partial plan view of a CIS structure illustrating adjacent information storage channels with surface charge launch-receive devices at the ends of the storage channels.

The operation of the embodiment illustrated in FIG. 2 can be best understood by considering a typical sequence of events which occur in the launching, transferring and receiving of surface charges in a CIS structure. For example, assume that surface charges are to be injected into the information storage and transfer channel 31. This may be controlled conveniently by applying a depletion region forming voltage to the conductor member 33 and by applying a reverse bias forming voltage to the P-N junction 40. By selecting the magnitude and duration of the voltage applied to the P-N junction 40, a charge of selected magnitude is injected into the depletion region underlying conductor member 33 and substantially confined to the vicinity of the information storage and transfer channel. By applying depletion region forming voltages to conductor members 34 and 36 while removing the depletion region forming voltage from conductor member 33, in a manner more fully disclosed in our copending application Ser. No. 56,353, the surface charge is transferred to the depletion region underlying these conductor members. Another charge may now be injected from the P region 38 and this charge transferred along the information storage and transfer channel 31 from left to right. In this way, information in the form of electrical surface charges are launched or injected into the CIS structure 30.

In a similar manner, information in the form of surface charges are received or extracted from the CIS structure. For example, assume that surface charges are moving from right to left in the information channel 32 by the appropriate application of depletion region forming voltages to conductor members 33 through 37. Then, when a surface charge arrives at the depletion region surrounding the reverse biased P-N junction 43, the charge is transferred to this depletion region. This is accomplished by first charging the capacitance of the P-N junction 43 to the predetermined voltage and then electrically isolating the charged P-N junction from the charging source except from the connection to the gate electrode 46 of transistor 45. The transfer of charge from the depletion region underlying conductor member 33 to the P-N junction 43 changes the predetermined voltage in proportion to the size of the charge. This change in voltage causes a change in current flow between the source and drain regions 47 and 48 which can be monitored and used as an indication of the existence of a received surface charge. The sequence of events then repeats itself. In this way, surface charges are received from the information storage and transfer channel.

When using a double diffused device similar to that illustrated in FIG. 1, the same sequence of events transpire as those described above with reference to FIG. 2, however, the output signal derived from this device is approximately equal to the magnitude of the surface charge device of the current amplification factor of the device.

Figures 3, 4:
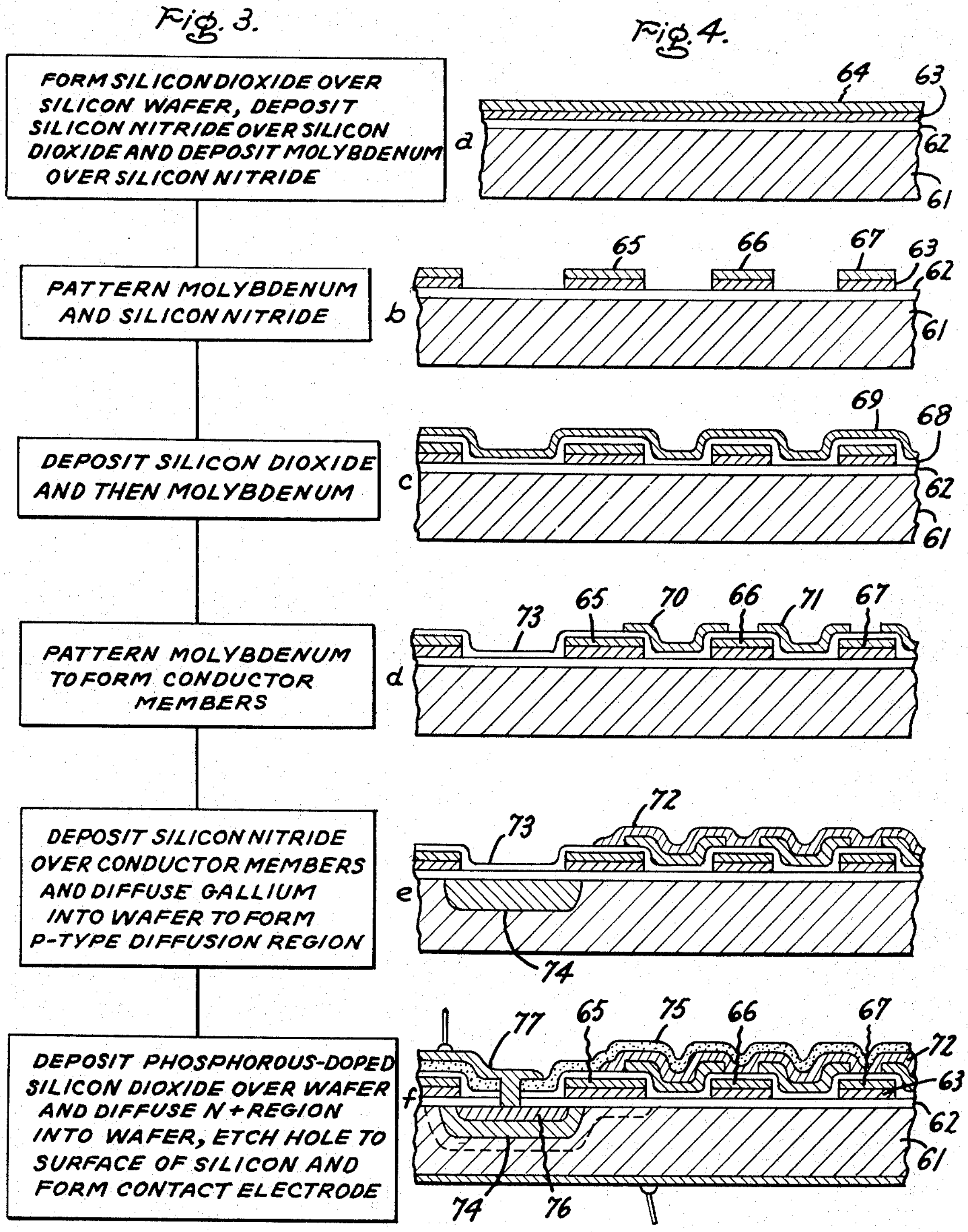
FIG. 3 is a flow diagram illustrating a process utilized in forming CIS structures with charge receive devices formed in the surface adjacent portion of a semiconductor body.

Having thus described some of the more desirable features of our invention in accord with FIGS. 1 and 2, a novel method of fabricating these and other devices useful in practising our invention is illustrated in the flow diagram of FIG. 3 and the series of schematic illustrations in FIGS. 4*a* – 4*f*. For ease of description, the invention will be described with reference to the formation of charge receive devices utilizing a silicon semiconductor body with insulatingly overlying conductor members of molybdenum. It is to be understood, of course, that the invention may be practised using other semiconductors such as germanium, gallium arsenide, cadmium sulfide or other group III-V and II-VI semiconductor compounds. Additionally, other conducting materials such as silicon and tungsten, for example, may also be used in the fabrication of charge receive devices in accord with our invention.

To begin the process, a suitable prepared wafer of silicon having, for example, a diameter of approximately 50 millimeters and a thickness of approximately 0.25 millimeters and a predetermined conductivity type, as, for example, N-type silicon is provided. The semiconductor wafer, illustrated by the numeral 61 is illustrated in FIG. 3 of the drawing. The wafer is inserted in a reaction chamber and heated to a temperature of the order of 1,000° – 1,200° C for approximately 1 to 2 hours in an atmosphere of pure dry oxygen to form a thermally grown film 62 of silicon dioxide of approximately 1,000 Angstroms (A) thickness. In some instances, and in particular, where it is desired to provide a plurality of information storage channels as more particularly described in our copending application Ser. No. 56,353, it is desirable to provide a much thicker film of silicon dioxide, such as 1 micron (10,000 Angstroms). In this latter situation, the thick film of silicon dioxide is patterned in accord with the desired configuration for the information storage channels, and re-grown to a thickness of approximately 1,000 A in the desired regions. FIGS. 3*a* – 3*f* are illustrative of a cross-sectional view taken along an information storage channel and do not illustrate, for purposes of clarity, the thicker film of silicon dioxide.

After formation of the film 62 of silicon dioxide, by whatever means employed, a film of silicon nitride ($Si_3N_4$) is deposited, as, for example, by the pyrolitic decomposition of silane and ammonia at 1,000°C. Times and temperature of formation may be varied as is well known in the art to secure the desired thickness of between 50 and 500 A.

After the formation of the silicon nitride film 63, the wafer is next coated with a molybdenum film 64 which may be formed, for example, upon the surface of the silicon nitride film 63 by pyrolytic decomposition of molybdenum pentachloride or by sputtering from a molybdenum cathode in a glow discharge of 0.015 Torr. of argon while the substrate is maintained at a temperature of approximately 400°C. In the case of sputtering from a molybdenum cathode, a thin molybdenum film 64 having a thickness of 3,000 a.u. is formed. The thickness of the molybdenum film is subject to variation and may readily be controlled by length of exposure to the sputtered molybdenum metal and the discharge current. In operation, films as thin as about 200 A and as thick as about 5,000 A may be formed and utilized in accord with our present invention.

Subsequent to the formation of the molybdenum film 64, a pattern of conductor members 65, 66 and 67 are formed in the molybdenum film. For example, the conductor members 65, 66 and 67 may be rectangular shaped elements having dimensions of 5 microns by 10 microns. In addition to patterning the molybdenum, the silicon nitride film 63 is also patterned. The patterning of the molybdenum film is accomplished by conventional photolithographic techniques using photoresist and irradiation thereof. For example, using the common photoresist, KMER, available from the Eastman Kodak Company of Rochester, New York, the desired pattern is formed therein by irradiation of the photoresist and after developing and suitably hardening the photoresist, the molybdenum is etched with a suitable solvent, such as an etch containing 76 percent orthophosphoric acid, 6 percent acetic acid and 3 percent nitric acid in water. A method of etching molybdenum and several other materials is more fully disclosed in our copending application Ser. No. 679,957, filed Oct. 13, 1967, now U.S. Pat. No. 3,566,518, incorporated herein by reference.

After etching the molybdenum film, the silicon nitride film is etched by using an etchant which attacks the silicon nitride but does not attack the molybdenum. A suitable etchant for this purpose is, for example, hot phosphoric acid. The details of etching a silicon nitride film while using a molybdenum film as a "transfer mask" is more fully disclosed in our copending application Ser. No. 871,730 filed Oct. 27, 1969, which is also incorporated herein by reference.

After etching the molybdenum and silicon nitride films, a layer of silicon dioxide is deposited over the wafer as, for example, by oxidation of silane or thermal decomposition and ethylorthosilicate. The silicon dioxide film 68 is then covered with a molybdenum film 69. The molybdenum film may, for example, be formed by sputtering from a molybdenum target or pyrolytic decomposition of molybdenum pentachloride as described above. The molybdenum film 69 is then patterned by photolithographic masking and etching techniques, well known in the art, to produce a pattern of conductor members 70 and 71 which are insulated from conductor members 65, 66 and 67 and overlap adjacent ones of these conductor members. More specifically, conductor member 70 insulatingly overlaps conductor members 65 and 66 and conductor member 71 insulatingly overlaps conductor members 66 and 67. It should be understood that although only 5 conductor members are illustrated, in general, a large number of conductor members are arranged in this way to provide a train of information storage and transfer devices.

After patterning the molybdenum conductor members 70 and 71, a film of silicon nitride 72 is deposited over the portion of a wafer having the conductor members 65, 66, 67, 70 and 71. The function of the silicon nitride film 72 is to prevent the diffusion of conductivity modifying impurities into the semiconductor wafer 61 in the regions underlying the conductor members. No silicon nitride, however, is provided within the silicon dioxide covered aperture 73, thereby permitting the diffusion of conductivity modifying impurities therethrough. More specifically, within the region defined by the silicon dioxide covered aperture 73, it is possible to introduce impurities which will diffuse into the underlying semiconductor wafer 31 and modify the conductivity thereof. For example, a P-type diffusion region 74 is formed in the surface adjacent portion of the semiconductor wafer 61 by diffusing gallium, for example, into the semiconductor wafer 61. After formation of the P-type region 74, the wafer is covered with a donor doped glass, such as silicon dioxide containing phosphorus. Phosphorus-doped glass may be deposited on the wafer by pyrolysis with ethylorthosilicate and phosphorus oxychloride ($POCl_3$) as is more fully disclosed in our copending application Ser. No. 863,654, now U.S. Pat. No. 3,685,140 of common assignee and incorporated herein by reference thereto.

After the formation of the phosphorus-doped silicon dioxide layer 75, the wafer is again heated in a reaction chamber at approximately 1,100°C for approximately one-half hour to cause the diffusion of phosphorus through the silicon dioxide covered aperture 73 into the semiconductor wafer 61. Alternately, the diffusion may be performed by the partial or substantially complete removal of the silicon dioxide in the aperture 73 prior to the deposition of the phosphorus-doped silicon dioxide layer 75. The times and temperatures of the diffusion process are adjusted so that an N+-type diffusion region 76 is formed within the P-type diffusion region 74.

Electrical contact is then made to a portion of the N+-type region 76 by etching a hole into the silicon dioxide to the semiconductor surface, for example, and coating the entire wafer with a sputtered or vacuum-evaporated layer of aluminum. Thereafer, the surface of the aluminum is masked with a photoresist and etched so as to leave selected regions constituting the electrode contacting the N+-type region 76 and other regions for providing electrical interconnections to other portions of the integrated circuit wafer. Although not illustrated, it should be understood that apertures may also be etched into the silicon dioxide and silicon nitride layers so that contact may be made to the conductor members. The device is completed by making electrical contact to enlarged electrode pads by thermocompression bonding, as is conventionally done in the fabrication of integrated circuits.

A surface charge launch-receive device constructed in accord with the foregoing procedure may be utilized to transform a relatively small electrical signal in the form of a surface charge to a relatively large signal for use by external circuitry. As described above, in certain situations, it may be unnecessary to provide the gain provided by the double diffused charge receive device. In such cases, a single diffusion region such as the P-type region formed in the N-type substrate would receive the stored charges. The fabrication of this latter device would be substantially similar to that described above but for the need to provide for the second diffusion region. This may be accomplished, for example, by omitting the gallium diffusion step and replacing the phosphorus-doped silicon dioxide layer 75 by a boron-doped silicon dioxide layer. Electrical contact to the P-type diffusion region is made in substantially the same manner as described above.

A particularly desirable characteristic of our invention is that the self-registration of the diffused P-region 18 and the edge of conductor member 65 affords a minimal capacity structure having a capacitance comparable to that of the storage elements themselves, thus capacitance mismatch between the storage elements and the launch-receive device is avoided. This and other advantages of our method of forming the various embodiments of our invention, such as the compatibility of this method with the formation of self-registered field-effect transistors on the same wafer are apparent to those skilled in the art.

For the sake of convenience, the invention has been described principally with respect to the use of molybdenum metal and silicon semiconductor material with the use of silicon dioxide and silicon nitride as insulating and masking films. Notwithstanding the description, other metals and insulating films may be employed. For example, other metals which are non-reactive with the insulating materials employed may also be used to advantage in practising the invention. Thus, for example, other materials such as tungsten and silicon may be used. Insulating films of aluminum oxide, for example, or other useful semiconductor device insulators may also be used in practising our invention.

While only certain embodiments and examples of the present invention have been described herein, it is apparent that many modifications and changes will occur to those skilled in the art. Accordingly, we intend, by the appended claim, to cover all such modifications and changes as fall within the true spirit and scope of the present invention.

We claim:

1. In combination, a substrate of semiconductor material of one conductivity type having a surface adjacent portion, a first conductive member insulatingly overlying a first region of the surface adjacent portion of said substrate, a second region in the surface adjacent portion of said substrate of opposite conductivity type contiguous with said first region, a third region of one type conductivity within said second region of opposite conductivity type to form a transistor in which said third region is the emitter, said second region is the base and said substrate is the collector, means for applying a first biasing voltage to said first conductive member with respect to said substrate to establish a surface potential of a first value therein, means for applying a second voltage in circuit with said third region and said substrate to reversely bias said second region with respect to said substrate and electrically float said second region with a potential of a second value thereon, means for conducting minority carriers representing a signal along said surface adjacent portion into said second region through said first region, means connected in circuit with said third region and said substrate for sensing the change in voltage on said second region in response to the flow of said minority carriers thereinto.

2. The combination of claim 1 in which the potential of said second value is energetically lower than the potential of said first value for said charge carriers.

3. The combination of claim 1 in which said charge carriers are in the form of packets of charge having a spatial periodicity, in which said means for conducting said charge carriers includes means for shifting each of said packets of charge carriers into said first region at a predetermined rate.

4. The combination of claim 1 in which said means for sensing includes a load impedance in circuit with said third region and a source of bias potential for said transistor.

5. The combination of claim 1 in which said means for conducting charge carriers includes a plurality of spaced conductor members insulatingly overlying the surface adjacent portion of said substrate to form an information storage and transfer channel for the transfer of electrical charges along the surface adjacent portion of said substrate, means for applying depletion producing voltages to said conductor members to form progressing depletion regions in the surface adjacent portion of said substrate to effect the transfer of charge along said channel, means for coupling charge from one of the depletion regions of said storage and transfer channel into said first region.

6. The combination of claim 1 in which said means for conducting charge carriers includes a first plurality of spaced conductor members insulatingly overlying the surface adjacent portion of said substrate and in insulating relationship therewith, and a second plurality of spaced conductor members insulatingly overlying the conductor members of said first plurality of conductor members with each of said second conductor members overlapping two adjacently spaced conductor members of said first plurality of conductor members to form an information storage and transfer channel for the transfer of electrical charges along the surface-adjacent portion of said substrate, means for applying a first pair of phase related voltages to said first plurality of conductor members and means for applying a second pair of phase related voltages to said second plurality of conductor means to incrementally move stored charge in said storage and transfer channel, means for coupling charge from one of said depletion regions of said storage and transfer channel into said first region.

7. The combination of claim 6 in which said first conductive member is included in said first plurality of spaced conductor members.

* * * * *